US011708265B2

(12) United States Patent
Leopold

(10) Patent No.: US 11,708,265 B2
(45) Date of Patent: Jul. 25, 2023

(54) METHOD FOR MANUFACTURING A MEMBRANE COMPONENT AND A MEMBRANE COMPONENT

(71) Applicant: X-FAB Global Services GmbH, Erfurt (DE)

(72) Inventor: Steffen Leopold, Ilmenau (DE)

(73) Assignee: X-FAB GLOBAL SERVICES GMBH, Erfurt (DE)

( * ) Notice: Subject to any disclaimer, the term of this patent is extended or adjusted under 35 U.S.C. 154(b) by 142 days.

(21) Appl. No.: 17/140,342

(22) Filed: Jan. 4, 2021

(65) Prior Publication Data

US 2021/0206629 A1    Jul. 8, 2021

(30) Foreign Application Priority Data

Jan. 8, 2020   (DE) ..................... 10 2020 100 244.0

(51) Int. Cl.
*B81C 1/00* (2006.01)
*B81B 3/00* (2006.01)
*G01L 9/00* (2006.01)

(52) U.S. Cl.
CPC ........ *B81C 1/00158* (2013.01); *B81B 3/0021* (2013.01); *B81B 2201/0264* (2013.01); (Continued)

(58) Field of Classification Search
CPC .......... B81B 3/0021; B81B 2201/0264; B81B 2203/0127; B81B 2203/019;
(Continued)

(56) References Cited

U.S. PATENT DOCUMENTS 5,632,854 A    5/1997 Mirza et al.
6,551,851 B2   4/2003 Gamble et al.
(Continued)

FOREIGN PATENT DOCUMENTS

DE    102004037304 A1   7/2004
DE       10305442 A1   8/2004
(Continued)

*Primary Examiner* — Shahed Ahmed
*Assistant Examiner* — Sun Mi Kim King
(74) *Attorney, Agent, or Firm* — Duane Morris LLP

(57) ABSTRACT

The present invention relates to a method for manufacturing a membrane component with a membrane made of a thin film (<1 µm, thin-film membrane). The membrane component can be used in microelectromechanical systems (MEMS). The invention is intended to provide a method for manufacturing a membrane component, the membrane being manufacturable with high-precision membrane dimensions and a freely selectable membrane geometry. This is achieved by a method comprising . . . providing a semiconductor wafer (100) with a first layer (116), a second layer (118) and a third layer (126). Depositing (12) a first masking layer (112) on the first layer (116), the first masking layer (112) defining a first selectively processable area (114) for determining a geometry of the membrane ($M_1$). Forming (13) a first recess (120) by anisotropic etching (13) of the first layer (116) and removing the first masking layer (112). Introducing (14) a material (122) in the first recess (120) and depositing (15) a membrane layer (124) on the first layer (116) with the introduced material (122). Depositing on the third layer (126) a second masking layer that defines a second selectively processable area. Forming a second recess by anisotropic etching of the third layer (126) and of the second layer (118) up to the first layer (116). Removing the second masking layer; and isotropically etching (18) the first layer (116), the isotropic etching being limited by the
(Continued)

membrane layer (124) and by the introduced material (122), so that the membrane ($M_1$) will be exposed.

18 Claims, 8 Drawing Sheets

(52) U.S. Cl.
CPC . *B81B 2203/019* (2013.01); *B81B 2203/0127* (2013.01); *B81C 2201/0125* (2013.01); *B81C 2201/0132* (2013.01); *B81C 2201/0133* (2013.01); *G01L 9/0045* (2013.01)

(58) Field of Classification Search
CPC .... B81C 2201/0125; B81C 2201/0132; G01L 9/0045
See application file for complete search history.

(56) References Cited

U.S. PATENT DOCUMENTS

| | | | |
|---|---|---|---|
| 7,487,681 | B1 | 2/2009 | Allen |
| 8,384,170 | B2 | 2/2013 | Getman et al. |
| 8,496,842 | B2 | 7/2013 | Udayakumar et al. |
| 9,324,760 | B2* | 4/2016 | Vasseur ............... G01J 5/12 |
| 2006/0093171 | A1* | 5/2006 | Zhe ............... H04R 31/003 |
| | | | 381/396 |
| 2006/0226114 | A1 | 10/2006 | Fischer et al. |
| 2010/0006840 | A1 | 1/2010 | Robert |
| 2012/0319217 | A1* | 12/2012 | Dehe ................... H04R 19/005 |
| | | | 438/488 |
| 2014/0134711 | A1 | 5/2014 | Boese |
| 2017/0078800 | A1 | 3/2017 | Guthy et al. |
| 2017/0219434 | A1 | 8/2017 | Udrea et al. |

FOREIGN PATENT DOCUMENTS

| | | |
|---|---|---|
| DE | 102008043699 B3 | 4/2010 |
| EP | 2036747 A1 | 3/2009 |
| EP | 2132547 B1 | 6/2011 |
| EP | 2848087 B1 | 11/2017 |
| EP | 3094112 B1 | 4/2019 |
| EP | 3557212 A1 | 10/2019 |
| FR | 2859281 B1 | 3/2005 |
| GB | 2558896 B | 10/2019 |
| WO | 2003106952 A2 | 12/2003 |
| WO | 2004071941 A2 | 8/2004 |
| WO | 2012040211 A2 | 3/2012 |
| WO | 2013167875 A1 | 11/2013 |
| WO | 2014179721 A1 | 11/2014 |
| WO | 2015132563 A1 | 9/2015 |
| WO | 2016/130123 A1 | 8/2016 |
| WO | 2017044625 A1 | 3/2017 |
| WO | 2017055806 A1 | 4/2017 |
| WO | 2017129966 A1 | 8/2017 |
| WO | 2018134552 A1 | 7/2018 |
| WO | 2018134553 A1 | 7/2018 |

* cited by examiner

METHOD FOR MANUFACTURING A MEMBRANE COMPONENT AND A MEMBRANE COMPONENT

INVENTION'S FIELD

The present invention relates to a method for manufacturing a membrane component with a membrane made of a thin film (<1 μm) (or thin-film membrane). The membrane component can be used in microelectromechanical systems (MEMS).

Generally known methods for manufacturing microstructures from a semiconductor wafer (e.g. silicon wafer), such as membranes made of thin films, are, inter alia, wet chemical etching of silicon (or silicon dioxide—$SiO_2$) with potassium hydroxide (KOH) and deep reactive ion etching (DRIE).

In the case of wet chemical etching of silicon making use of a caustic solution such as KOH, an anisotropic etching reaction is obtained for the etching reaction due to the different activation energies of the Si atoms of the various crystal planes. By means of KOH etching of silicon wafers, pyramids with a square base and {111} planes as lateral faces can be realized for (100) oriented wafers and rectangular trenches with {111} planes as flanks for (110) oriented wafers. Other shapes cannot be realized making use of this method. In principle, precise lateral dimensions can be achieved by KOH etching using the {111} plane as a natural etch stop in the silicon. However, in particular the etching of (100) oriented wafers requires, for process-related reasons, large chip dimensions due to the exclusively pyramidally etchable structure.

Deep reactive ion etching, as a further development of reactive ion etching (RIE), is a highly anisotropic dry etching process for the production of microstructures in silicon, in which structure depths of a few 100 μm perpendicular to the wafer surface can be accomplished. Appropriate masking, such as masking produced by means of photolithography, allows here the shaping of the structures to be achieved. Also, circular or rectangular geometries or geometries having some other shape, with almost perpendicular sidewalls, can be created in this way. Due to process variations during the DRIE process, the sidewalls usually have a sidewall angle of approx.±2.0°. Hence, the initial lithographic accuracy of the masking and the accuracy of the dimensions of the structure to be accomplished will be lost.

BACKGROUND ART

Various methods for manufacturing thin-film membranes are suggested.

FR 2 859 281 B1 discloses an MEMS pressure sensor having a structure configured to limit excessive deformation of the membrane included in the pressure sensor, so as to prevent damage to the membrane. The membrane itself is produced via standard processes, as described above (KOH etching or deep reactive ion etching).

Also EP 2 132 547 B1 (n.b. EP publication number corrected by translator) discloses an MEMS pressure sensor and a method for manufacturing this pressure sensor, which is able to compensate for measurement errors due to a bending-resistant center on the back of the thin-film membrane for pressure measurement of low pressures. During the manufacturing process, a BESOI (Bonded and Etchback Silicon on Insulator) wafer is taken as a basis and the back of the carrier substrate is etched, with the buried oxide layer acting as an etch stop. The resultant opening for exposing the membrane has a conically tapering inner circumferential surface. For manufacturing the bending-resistant center, the oxide layer, which previously served as an etch stop, is removed only partially. In an outer edge of the oxide layer area exposed by the opening, a groove surrounding the area is provided.

WO 2016/130123 A1 describes the manufacture of a micromechanical device including a membrane and having improved cavity structures, so as to reduce the size of the membrane. The first step in the manufacturing process is etching the epitaxial layer (deep reactive ion etching) on a silicon-on-insulator wafer (SOI wafer), so as to create bosses corresponding to the (reinforcement) structures of the membrane to be manufactured later on. The etched epitaxial layer is bonded to a layer of an additional substrate, this layer being etched as well. The etched side of the additional substrate has an essentially square etched recess (deep reactive ion etching), which together with the recesses of the SOI wafer forms the cavity below the membrane. Finally, the substrate layer of the SOI wafer is removed and the back of the additional substrate is etched so that the cavity below the membrane will have a connection to the surroundings.

EP 3 557 212 A1 discloses a capacitive MEMS pressure sensor having an increased temperature resistance as well as its manufacture. The pressure sensor is particularly suitable for sensing air pressures during air vehicle operations of air vehicles and comprises a backing plate with a central hole to which a membrane is bonded. The (silicon) membrane is formed on both sides from a silicon wafer by etching recesses in the top and bottom of the wafer. The circumferential surfaces have a conical shape tapering towards the center of the wafer. The membrane has bonded thereto an insulation frame to which a plate with an electrode is fastened. The insulation frame, the plate with the electrode and the membrane enclose a cavity between them. The membrane and the plate with the electrode form a capacitive sensor that changes output upon deflection of the membrane relative to the electrode.

U.S. Pat. No. 7,487,681 B1 discloses a pressure sensor having a cross-shaped backside opening that provides a variable sensitivity. In the manufacturing process of a membrane of the pressure sensor, the membrane is first patterned and exposed on the backside by means of DRIE. Subsequently, an additional layer (also backside) is bonded to the structure produced (wafer bonding). A through-hole is etched (DRIE) into this additional layer (frame) so that a continuous cavity is created under the membrane.

SUMMARY OF THE INVENTION

It is the object of the present invention to provide a method for manufacturing a membrane component, by means of which a membrane component with a membrane with high-precision membrane dimensions and a freely selectable membrane geometry can be manufactured.

This object is achieved by a (first) method for manufacturing a membrane component, by a membrane component, by a method or by a membrane component.

The (first) method for manufacturing a membrane component with a membrane comprises providing a semiconductor wafer with a first layer, a second layer and a third layer and depositing a first masking layer on the first layer. The first masking layer defines a first selectively processable area for determining a geometry of the membrane. The method further comprises forming a first recess by anisotropic etching of the first layer, removing the first masking layer, introducing a material in the first recess, depositing on the third layer a second masking layer that defines a second selectively processable area, forming a second recess by anisotropic etching of the third layer and of the second layer up to the first layer, removing the second masking layer, and isotropically etching the first layer. The isotropic etching is limited by the membrane layer and by the introduced material, so that the membrane will be exposed.

The membrane component may be an unfinished semiconductor device (as a precursor or a semi-finished product) or a component to be integrated in a semiconductor device. For example, in further processing steps, the membrane component may be processed into a finished semiconductor device or further processed and then used as a component in a device, such as an MEMS pressure sensor.

A (layer) material may have a surface (e.g. a surface of a silicon layer). A region of the surface may be a selectively processable surface. This region as a selectively processable surface can be processed within a process step, while a remaining area of the surface portions remains unprocessed. For example, a masking layer (as an etch mask) with at least one opening can be deposited on a layer of a semiconductor wafer. A region covered by the masking layer may not be processable. A region of the layer uncovered or exposed through the opening of the masking layer may be the selectively processable area. By means of a chemical ablation, such as anisotropic etching, the selectively processable area can be processed. An ablation of the selectively processable area may be carried out such that a recess in the material is created, which has a basic shape corresponding to the selectively processable area.

The membrane layer may be applied areally. The membrane layer may comprise the membrane.

The membrane within the membrane layer may be exposed on both sides, and in particular the membrane is oscillatable and adapted to undergo deformation in a direction perpendicular to a plane defined by a surface of the membrane.

The membrane layer, except for the membrane, may be fixed to a surface or a frame and may be non-oscillatable.

The membrane may be permeable, and in particular the membrane may be permeable to air and/or water.

The first selectively processable area may be formed through at least one opening in the first masking layer, and in particular, the selectively processable area may be a surface of a material below the masking layer, the surface being not covered by the masking layer.

The first masking layer may serve as an etch mask. The selectively processable area may define a geometry (or base) to be etched into a depth of the material below the masking layer.

The first selectively processable area may have e.g. the geometry of a circular ring. A region enclosed by the circular ring may define the membrane geometry of the membrane to be manufactured.

The first selectively processable area may be a rectangular ring, a polygonal ring, or a non-circular ring.

The first selectively processable area may enclose a region that defines the membrane geometry of the membrane to be manufactured.

The first and/or second masking layers may comprise a photoresist, a silicon dioxide, or a silicon nitride.

The first and/or second masking layer may comprise a positive resist.

The definition of the opening in the first masking layer for defining the first selectively processable area may be carried out by means of lithographic processes. The same may apply to the second selectively processable area.

The first masking layer and/or the second masking layer may comprise hard masks. The hard masks may be patterned by means of lithographic processes.

Anisotropic etching may comprise anisotropic reactive ion etching, in particular deep reactive ion etching.

Anisotropic etching of the first recess may comprise a deep trench isolation (DTI) process (trench etching).

The first recess may have a base corresponding to the first selectively processable area.

The first recess may extend up to and into the second layer.

The first recess may be formed up to the second layer, and in particular, a surface of the second layer may be exposed by the recess.

The removal of the first and/or the second masking layer may be carried out by stripping or by plasma ashing. Stripping may comprise removal by an organic solvent, caustic soda, or a remover (alkaline or neutral liquids).

Placement of the material into the first recess may be carried out within the DTI process by means of a chemical vapor deposition process.

The membrane layer may comprise aluminum nitride, and in particular, the membrane layer may be made of aluminum nitride.

The membrane layer may be a thin film. The membrane layer may be deposited on the first layer, e.g. by means of sputtering (reactive sputtering).

Isotropic etching may comprise wet chemical etching processes.

The method may further comprise, after the removal of the second masking layer, depositing a fourth layer on the third layer, on the first layer and on at least one sidewall of the second recess created by anisotropically etching the third and the second layer, and anisotropically etching an area of the fourth layer, the area of the fourth layer contacting the first layer, up to the first layer.

The fourth layer may be deposited on all the sidewalls of the second recess created by anisotropically etching the third and the second layer.

The fourth layer may serve as a sidewall passivation and protect the at least one sidewall (sidewalls) during subsequent process steps.

The fourth layer may comprise an oxide layer, and in particular, the fourth layer may be an oxide layer.

When the area of the fourth layer is subjected to anisotropic etching, the at least one sidewall may not be included, in particular a removal from the at least one sidewall should be avoided or avoided as far as possible.

Anisotropic etching of the fourth layer may be carried out up to and into the first layer, and in particular, a surface of the first layer is exposed.

The method may additionally comprise, prior to applying the membrane layer, polishing the first layer with the introduced material. The polishing may in particular comprise chemical-mechanical polishing.

The first layer may comprise a material different from that of the second layer, and in particular, it may be made of a different material.

The first layer may comprise a silicon layer, and in particular, the first layer may be a silicon layer.

The second layer may comprise an oxide layer, and in particular, the second layer may be an oxide layer.

The semiconductor wafer may be a silicon-on-insulator (SOI) wafer. The SOI wafer may comprise three layers: a carrier substrate layer (handle layer), an oxide layer (BOX layer) and a device layer.

The carrier substrate layer of the SOI wafer may have a thickness between 200 µm and 2000 µm.

The oxide layer of the SOI wafer may have a thickness between 0.05 µm and 10.00 µm.

The device layer of the SOI wafer may have a thickness between 0.10 µm and 200.00 µm.

The first layer may have a first layer thickness smaller than a fourth thickness resulting from the summation of a second layer thickness of the second layer and a third layer thickness of the third layer, in particular a ratio of the first layer thickness to the fourth thickness may lie between 1:10 and 1:200, preferably between 1:50 and 1:150, and may more preferably be 1:100.

The first layer thickness may be smaller than the third layer thickness, in particular a ratio of the first layer thickness to the third layer thickness may lie between 1:8 and 1:200, preferably between 1:50 and 1:150.

The first layer may, in particular, have such a thickness that a deviation occurring, for process-related reasons, due to anisotropic etching is smaller than a predetermined tolerance of the membrane geometry.

The fourth layer may comprise a passivation layer.

The first and/or the second masking layer may comprise a photoresist, and in particular the first and/or the second masking layer are produced by means of photolithography.

The introduced material and the second layer may comprise an identical material.

The membrane may have a circular, a rectangular, a polygonal, or a non-circular basic shape.

The membrane may have at least one opening, and in particular, the membrane may be perforated.

Isotropic etching may be carried out through the at least one opening of the membrane.

The (claimed) membrane component comprises a membrane layer, a first layer, a second layer and a third layer. The membrane layer comprises a membrane. The first layer has a first layer thickness. A material is, at least partially, surrounded (enclosed) by the first layer. The surrounded material determines a geometry of the membrane. The second layer has a second layer thickness and the third layer has a third layer thickness. The first layer thickness is smaller than a fourth thickness resulting from the summation of the second layer thickness of the second layer and the third layer thickness of the third layer.

Through the first layer, in particular the at least partially surrounded material may be surrounded completely in a plane by the first layer.

A ratio of the first layer thickness to the fourth thickness may lie between 1:10 and 1:200, preferably between 1:50 and 1:150, and may more preferably be 1:100.

A ratio of the first layer thickness to the third layer thickness may lie between 1:8 and 1:200, preferably between 1:50 and 1:150.

An angle α included between the membrane layer (or the membrane) and a sidewall of the introduced material may lie between 88.0° and 92.0°, in particular between 89.0° and 91.0°.

The membrane may have a circular, a rectangular, a polygonal, or a non-circular basic shape.

The membrane layer may have at least one opening and may in particular be perforated.

The (further) method for manufacturing a membrane component comprises providing a semiconductor wafer. The semiconductor wafer comprises a first layer, a second layer and a third layer. In addition, the method comprises depositing a first masking layer on the first layer. The first masking layer defines a selectively processable area for determining a geometry of the membrane. Furthermore, the method comprises anisotropic etching of the first layer and the second layer down to the third layer, removing the first masking layer, modifying, at least partially, the third layer, so that a layer modification extends into a depth of the third layer, removing the first layer, removing the second layer, so that the third layer with a layer modification remains, depositing a membrane layer on the third layer with the layer modification, depositing on the third layer a second masking layer defining a second selectively processable area, anisotropically etching the third layer up to the layer modification and isotropically etching the layer modification. The isotropic etching of the layer modification is limited by the membrane layer and by the third layer, so that the membrane will be exposed.

The membrane component may be a precursor of the finished component.

The method for manufacturing the membrane component may be followed by further process steps. Further process steps may take place at or on the membrane component.

The membrane component may in particular be integratable in MEM systems.

The membrane layer may be deposited areally. The membrane layer may comprise the membrane. The membrane may in particular not be covered by solid material (exposed on both sides). In particular, the membrane is oscillatable or deformable and is adapted to undergo deformation in a direction perpendicular to a plane defined by a surface of the membrane.

The membrane layer, except for the membrane, may be fixed to some other material, which material may serve as a carrier material or a frame.

The first selectively processable area may be formed through at least one opening in the first masking layer.

The first selectively processable area may have a circular, a rectangular, a polygonal, or a non-circular shape.

The first and/or the second masking layer may comprise a photoresist, silicon dioxide, or silicon nitride.

The definition of the first opening in the first masking layer for defining the first selectively processable area and/or the definition of a (second) opening in the second masking layer for defining the second selectively processable area may be carried out by means of lithographic processes.

The method may comprise a LOCOS process (Local Oxidation of Silicon).

Modifying the third layer may comprise thermal oxidation.

Removing the first layer may comprise wet chemical etching.

Removing the second layer may also comprise removing material grown, at least in part, through the thermal oxidation, and in particular, additional material grown through the thermal oxidation may be removed completely.

The semiconductor wafer may comprise a silicon wafer.

The depth of the layer modification into the third layer (or the thickness of the layer modification) may be smaller than a layer thickness of the third layer, and in particular, a ratio of the depth of the layer modification to the layer thickness of the third layer may lie between 1:5 and 1:150 and may preferably be 1:100.

The membrane may have at least one opening, and in particular it may be perforated.

Anisotropic etching may take place through the at least one opening of the membrane.

The first and/or the second masking layer may comprise a photoresist, and in particular, the first and/or the second masking layer may be produced by means of photolithography.

The (claimed) membrane component comprises a membrane layer with a membrane and a carrier layer with a cavity. The cavity comprises a first and a second section. The first section of the cavity has a first depth. The first section of the cavity determines a geometry of the membrane. The second section of the cavity has a second depth. The first depth is smaller than the second depth.

A ratio of the first depth to the second depth may lie between 1:5 and 1:150, and preferably the ratio may be 1:100.

An angle α included between the membrane layer or the membrane and a sidewall of the first section of the cavity may lie between 88.0° and 92.0°, and in particular, between 89.0° and 91.0°.

The membrane may have a circular, a rectangular, a polygonal, or a non-circular basic shape.

The membrane may have at least one opening and may in particular be perforated.

The first section may have a first lateral dimension and the second section may have a second lateral dimension, and the first lateral dimension may be unequal to the second lateral dimension, in particular the second lateral dimension may be smaller than the first lateral dimension.

The second lateral dimension may be 50% smaller than the first lateral dimension, preferably 30%, and more preferably 20%.

INTRODUCTION TO THE DRAWINGS

The embodiments of the present invention are described on the basis of examples, but they are not described in a way allowing limitations to be transferred from the figures to the claims or to be read into the claims. Like reference numerals stand for like elements.

FIG. 1 shows schematic representations 11, 12, . . . , 15 of a pre-patterning of an SOI wafer 100 at various stages of pre-patterning of the SOI wafer 100 and a deposition of a continuous membrane layer 124, each shown in a sectional view, for manufacturing a membrane component 190;

Figure 4:
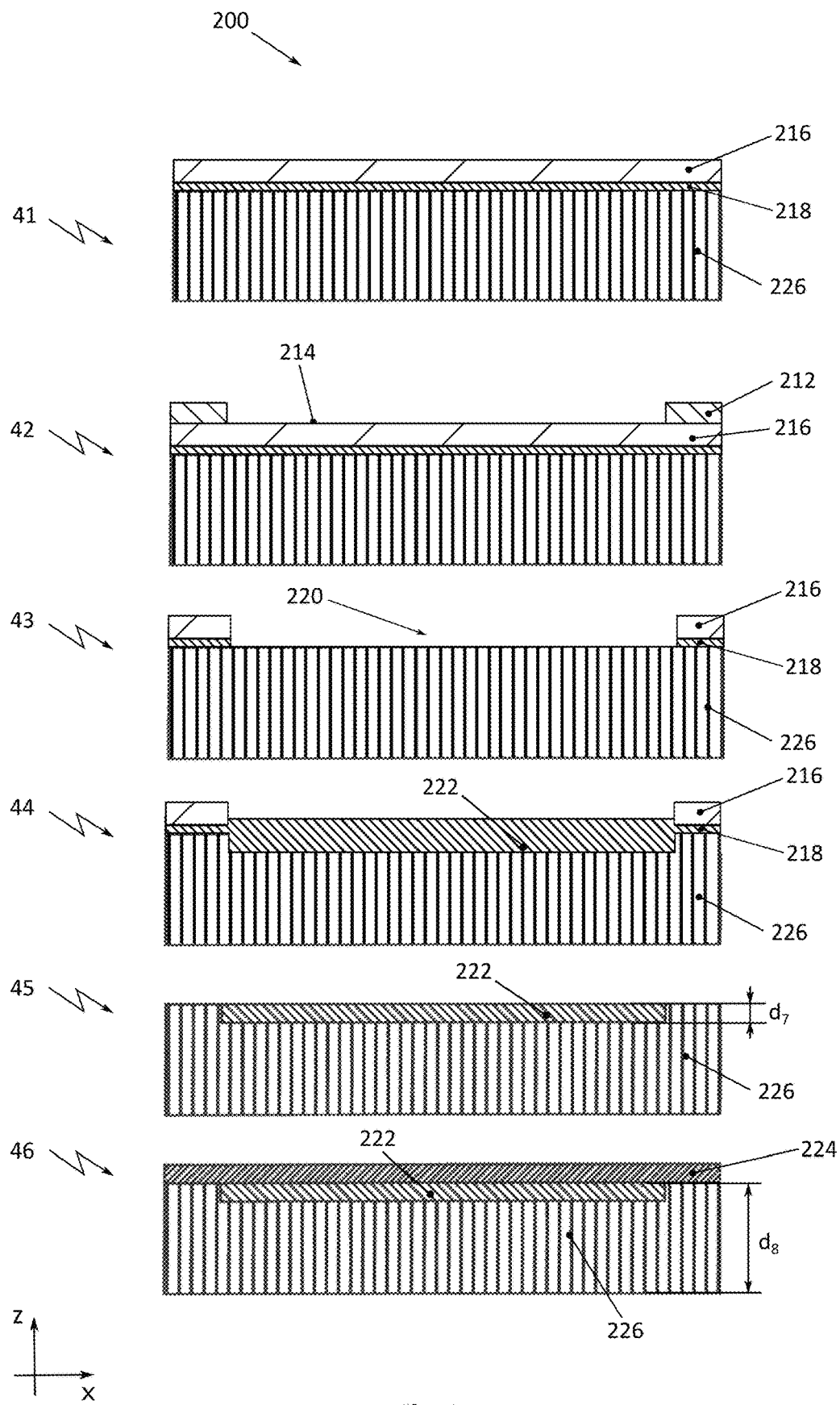
Figure 5:
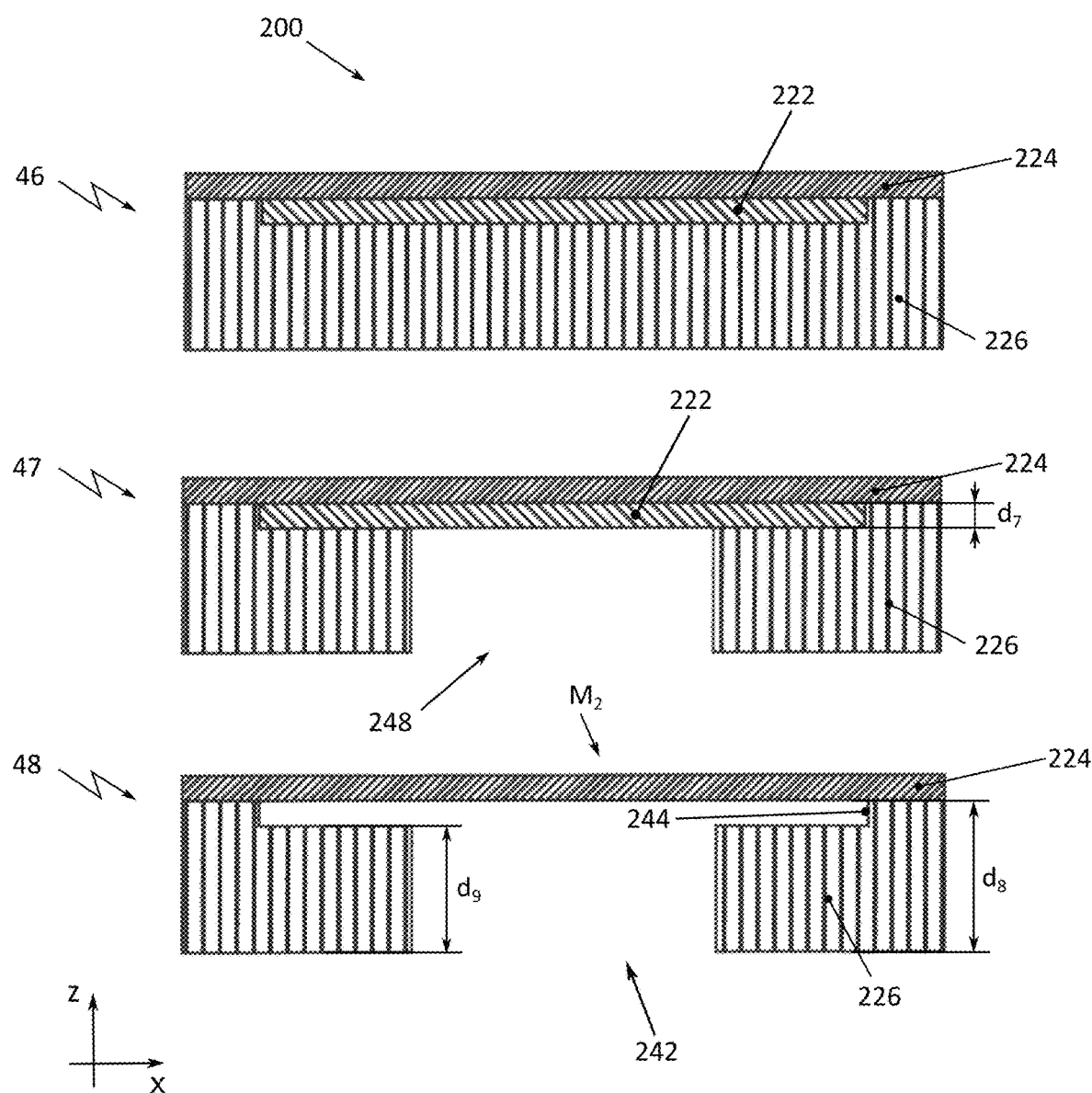
Figure 6:
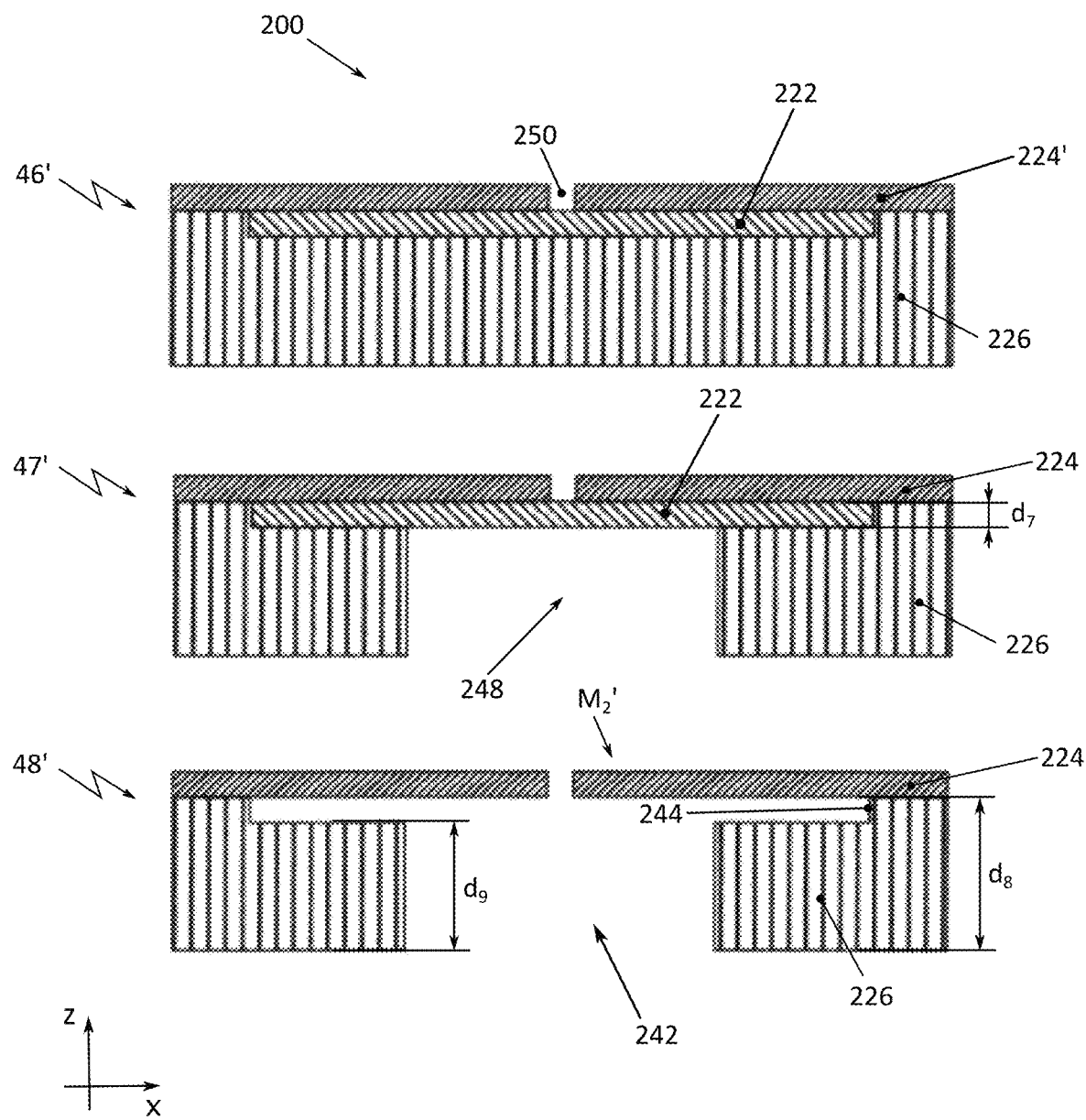
Figure 7:
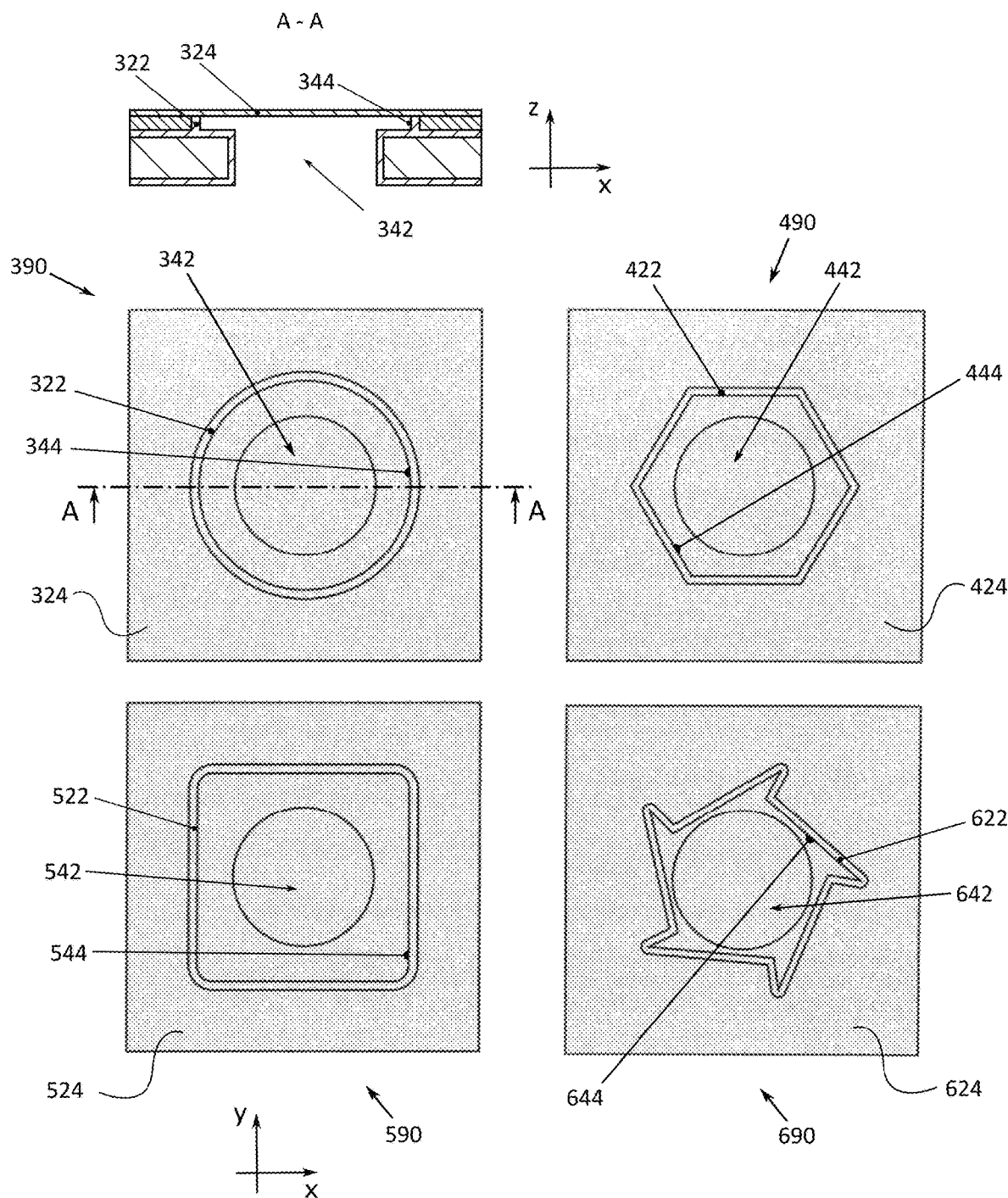
Figure 8:
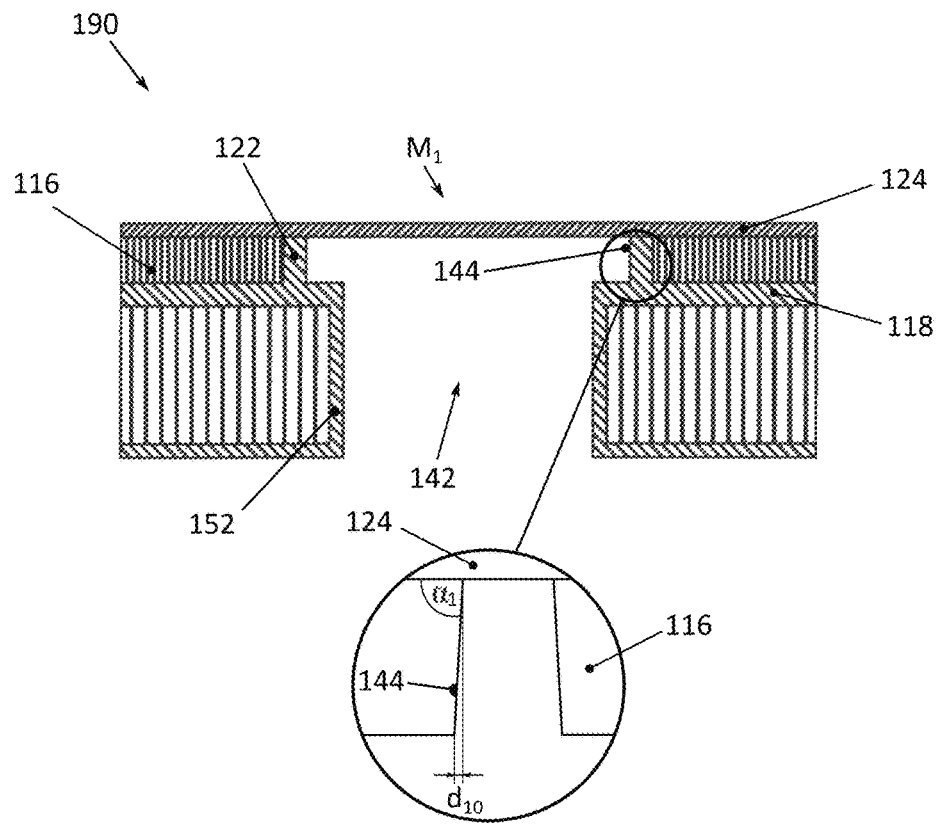

FIG. 4 shows schematic representations 41, 42, . . . , 46 of a pre-patterning of a silicon wafer by means of local oxidation at various stages of the pre-patterning of the silicon wafer, and a deposition of a continuous membrane layer 224 for the manufacture of a membrane component 290, each shown in a sectional view;

FIG. 5 shows schematic representations 46, 47, 48 of a membrane component manufacture of the silicon wafer pre-patterned by local oxidation and provided with a continuously deposited membrane layer 224 at various stages of membrane component manufacture, each shown in a sectional view;

FIG. 6 shows schematic representations 46', 47', 48' of a membrane component manufacture of a silicon wafer pre-patterned by local oxidation and provided with a discontinuously deposited membrane layer 224' at various stages of manufacture, each shown in a sectional view;

FIG. 7 shows schematic representations of membrane geometries in a top view;

FIG. 8 shows a schematic representation of the membrane component 190 in a sectional view and a detail extract of the membrane component.

Figure 9:
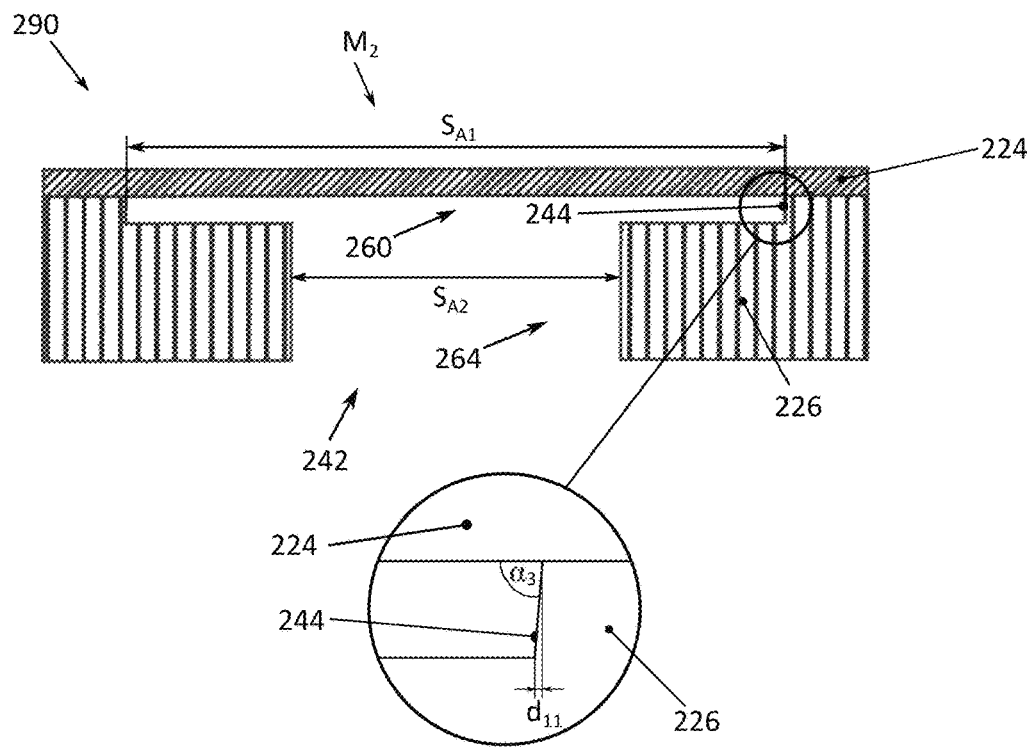

FIG. 9 shows a schematic representation of the membrane component 290 in a sectional view and a detail extract of the membrane component.

DETAILED DISCLOSURE

Figure 1:
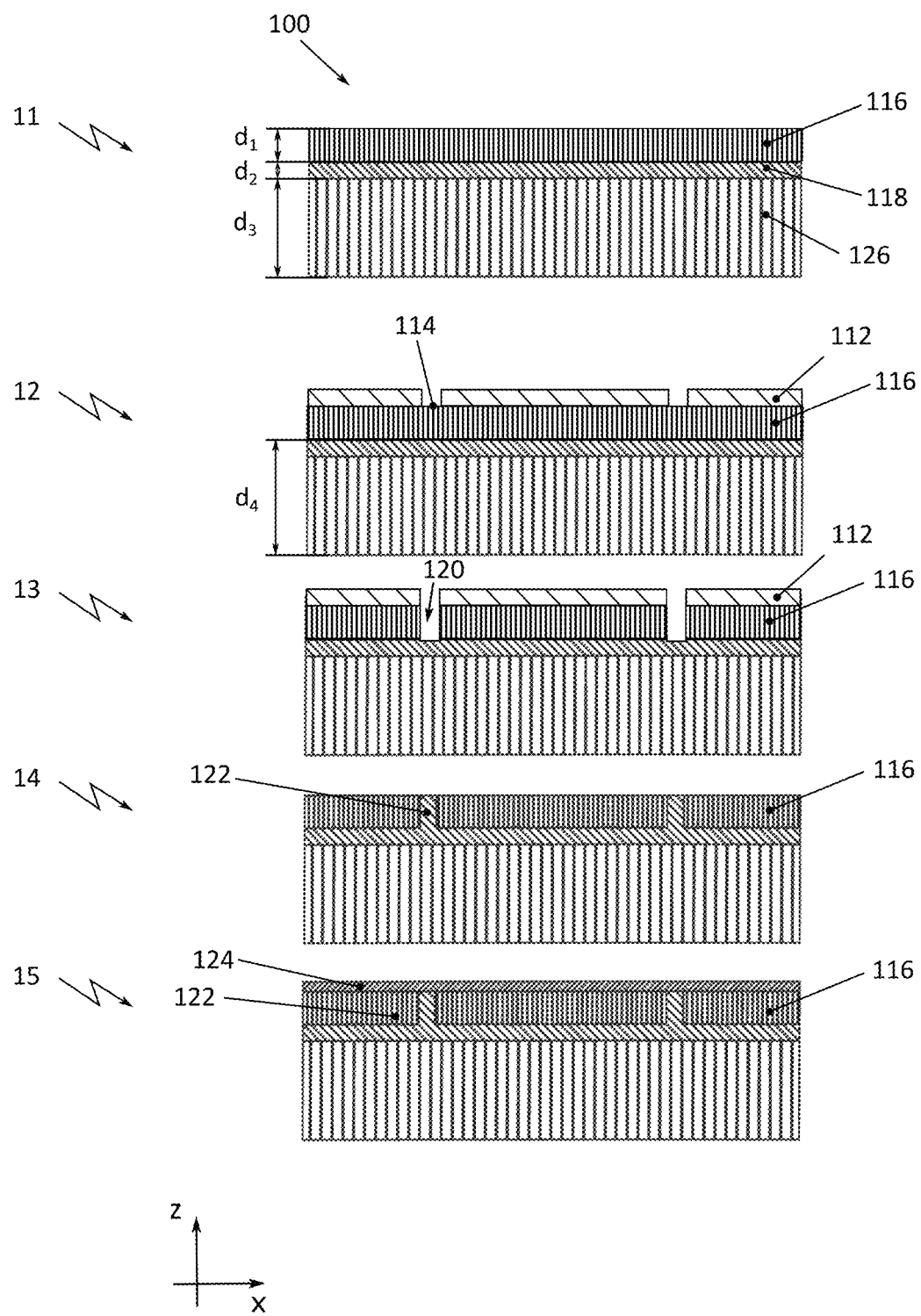

FIG. 1 shows a pre-patterning of an SOI wafer 100 at various stages of pre-patterning of the SOI wafer 100 and a deposition of a continuous membrane layer 124, each shown in a sectional view, for manufacturing a membrane component 190.

Section 11 shows the semiconductor wafer 100 of a type that may be provided for a method for manufacturing the membrane component 190. The semiconductor wafer comprises three layers: a first layer 116, a second layer 118, and a third layer 126.

The first layer 116 has a first layer thickness $d_1$, the second layer 118 has a layer thickness $d_2$, and the third layer 126 has a layer thickness $d_3$. A fourth thickness $d_4$ results from the summation of the layer thicknesses $d_2$ and $d_3$.

The semiconductor wafer 100 may be an SOI wafer. Accordingly, the first layer 116 may be a (thin) silicon layer, the second layer 118 may be a (thin) oxide layer (BOX), and the third layer 126 may be a carrier substrate layer made of silicon.

Section 12 shows the semiconductor wafer 100 with an additionally deposited masking layer 112. The masking layer 112 has an opening.

The opening may preferably have an annular basic shape.

In the example shown, an annular opening is shown. Correspondingly, depicted depressions are shown as portions of the opening and connected to each other.

The first masking layer 112 may be formed by means of photolithographic processes and may serve as an etch mask.

The masking layer 112 may comprise a photoresist. The photoresist may be applied by spin coating.

The opening in the masking layer 112 can be removed, for example, by means of development or exposure (positive resist).

The opening in the first masking layer 112 exposes a first selectively processable area 114 on the first layer 116. A surface of the first layer 116, with the exception of the area 114, is covered by the masking layer 112.

Section 13 shows the semiconductor wafer 100 after anisotropic etching (in a z-direction) of the first layer 116.

The anisotropic etching of the first layer may include trench etching by deep reactive ion etching.

The anisotropic etching may, in sections, take place through the entire layer thickness of the first layer 116 (in a z-direction) and at least partially through the second layer 118. Preferably, the anisotropic etching can be stopped, when a surface of the second layer 118 has been exposed, without residues of the first layer 116 remaining on the exposed surface of the second layer 118. The first recess 120 shown can thus be created by the anisotropic etching.

The recess 120 has a basic shape that (substantially) corresponds to the first selectively processable area 114.

Section 14 shows the semiconductor wafer 100 without the masking layer 112 and with a material 122 introduced into the recess 120.

For example, the first masking layer 112 can, if the masking layer comprises a photoresist, be removed by means of a remover (e.g. acetone, 1-methyl-2-pyrrolidone (NMP), dimethyl sulfoxide (DMSO), etc.), stripping, or ashing ($O_2$ ashing).

The introduced material 122 and the second layer 118 may both comprise an oxide material (oxide layer material).

The introduced material 122 can be introduced into the second layer 118 by means of trench isolation (deep trench isolation) (thermal oxidation and filling of the trench with CVD oxide).

When the material 122 has been introduced, a subsequent polishing step (chemical-mechanical polishing) may be carried out.

Section 15 shows the semiconductor wafer 100 with the additionally deposited membrane layer 124.

The membrane layer 124 may be deposited areally.

The membrane layer may comprise aluminum nitride (AlN), in particular the membrane layer may be made of aluminum nitride.

The membrane layer may be deposited by physical vapor deposition (PVD), sputtering or metal organic chemical vapor deposition (MOCVD).

Figure 2:
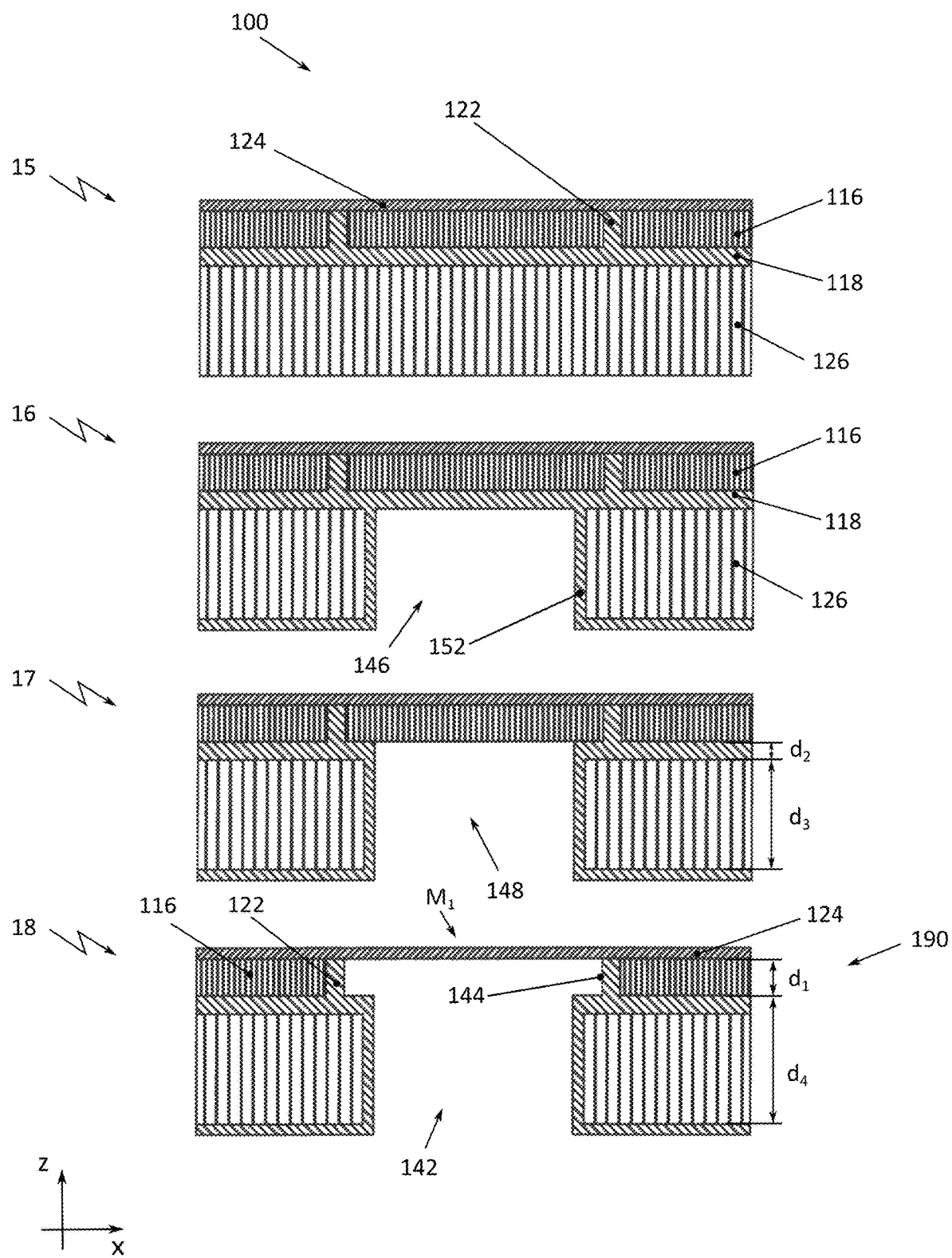
FIG. 2 shows schematic representations 15, 17, 18 of the membrane component manufacture from the pre-patterned SOI wafer with a continuously deposited membrane layer 124, at various stages of manufacture, each shown in a sectional view.

FIG. 2 shows the completion of the membrane component on the basis of the pre-patterned SOI wafer with the continuously deposited membrane layer 124, at various stages of manufacture, each shown in a sectional view.

Section 15 according to FIG. 1 is shown again, for simplifying the understanding of the manufacturing process, and represents the starting point for the following process steps.

Section 16 shows the pre-patterned semiconductor wafer 100 with a fourth layer 152 deposited, in sections, on the first layer 116, the third layer 126 and sidewalls of a recess in the third layer 126 and the second layer 118.

The recess in the third layer 126 and the second layer 118 may be produced by anisotropic etching of the third layer 126 and the second layer 118. The anisotropic etching of the third and of the second layer may be carried out selectively and, in particular, the geometry of the recess may be determined by previously masking the third layer 126 or by applying thereto a second masking layer with an opening defining a second selectively processable area.

The anisotropic etching may stop on the first layer 116. In particular, the anisotropic etching of the third layer 126 can be stopped, when a surface of the first layer has been (completely) exposed, without residues of the second layer 118 remaining on the first layer 116. Subsequently, the fourth layer 152 may be deposited.

The fourth layer 152 may comprise an oxide layer, and in particular, the fourth layer 152 may be an oxide layer.

The fourth layer 152 may comprise a passivation layer, and in particular, the fourth layer 152 may be a passivation layer.

A cavity 146 is formed (enclosed) by sidewalls of the fourth layer 152.

The cavity 146 may have a circular base.

Section 17 shows the semiconductor wafer 100 after another anisotropic etching step (in a z-direction) of the fourth layer 152, so that the cavity 142 is formed (as a recess of the cavity 148). The area etched (removed) is exclusively the area of the fourth layer 152 that contacted the second layer 118, a surface of the first layer 116 being thus exposed.

Section 18 shows the semiconductor wafer 100 (or membrane component 190) with the first layer 116 partially removed.

A portion of the first layer 116 enclosed by the membrane layer 124 and by the introduced material 122 can be removed by means of an isotropic etching step. The isotropic etching can be stopped by the membrane layer 124 and by the introduced material 122 so that a recess 142 is formed that extends up to underneath the membrane layer 124 and up to a sidewall 144 (sidewalls) of the introduced material, thereby exposing the membrane layer 124 on both sides.

The portion of the membrane layer 124 exposed on both sides forms a membrane $M_1$.

Figure 3:
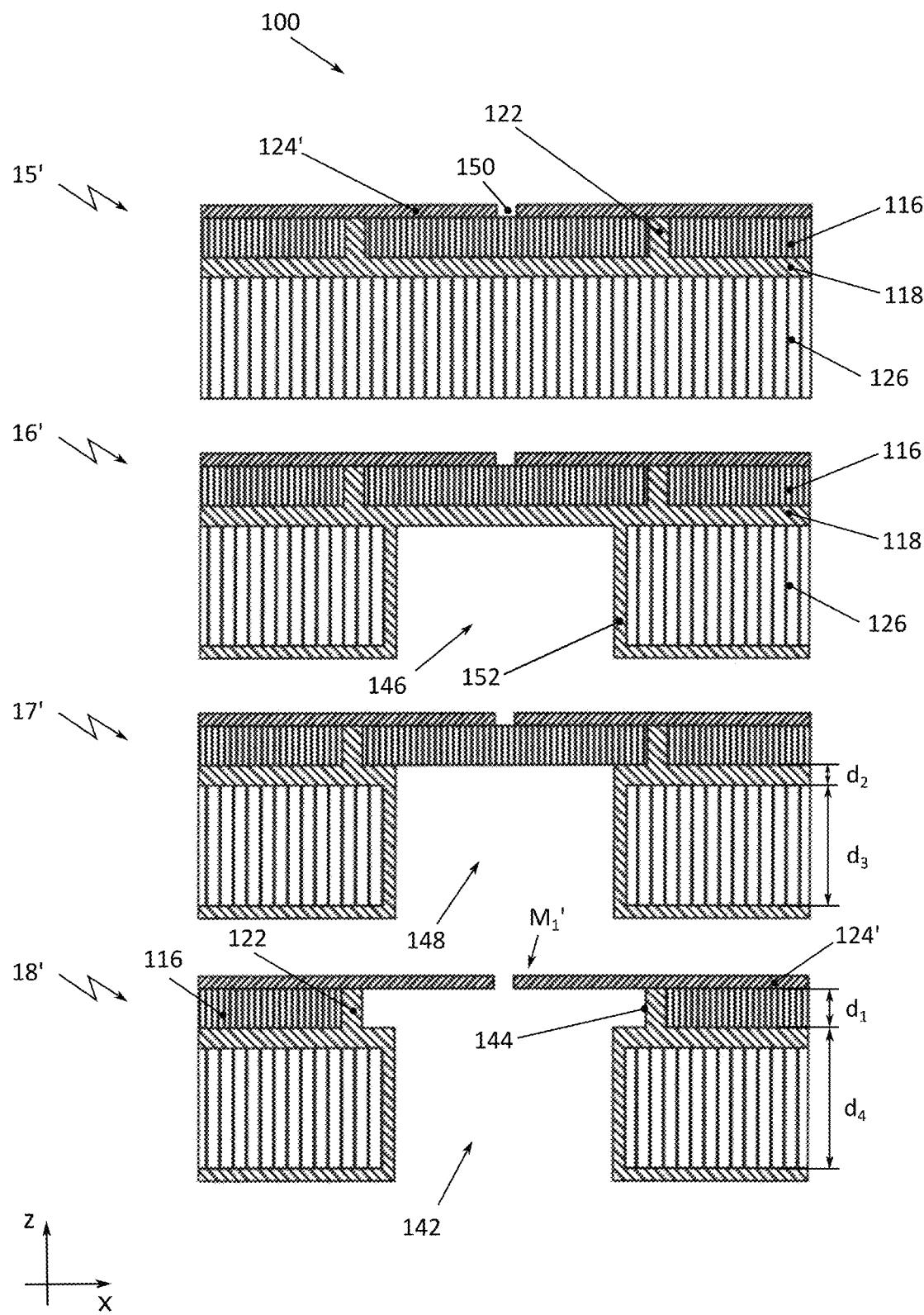
FIG. 3 shows schematic representations 15', 17', 18' of the membrane component manufacture from a pre-patterned SOI wafer with a discontinuously deposited membrane layer 124' at various stages of manufacture, each shown in a sectional view.

FIG. 3 shows a manufacture of a membrane component 190' from a pre-patterned SoI wafer with a discontinuously deposited membrane layer 124' at various stages of manufacture, each shown in a sectional view.

The representations according to sections 15' to 18' correspond substantially to the sectional views 15 to 18 according to FIG. 2, except that the membrane layer 124' has an opening 150.

The membrane $M_1'$ may have a plurality of openings, in particular it may be perforated.

An isotropic etching of the semiconductor wafer 100 for removing a part of the first layer 116, as shown in 18', can be carried out through the opening 150 (on the front side).

FIG. 4 shows a pre-patterning of the semiconductor wafer 200 by means of a layer modification (local oxidation) at various stages of the pre-patterning of the semiconductor wafer 200 and a deposition of a continuous membrane layer 224, each shown in a sectional view, for the manufacture of a membrane component 290.

Section 41 shows the semiconductor wafer 200. The semiconductor wafer 200 includes a first layer 216, a second layer 218, and a third (carrier) layer 226 (silicon wafer). The third layer 226 has a layer thickness $d_8$.

The first layer 216 may comprise a silicon layer, and in particular, the first layer 216 may be a silicon nitride layer.

The second layer 218 may comprise an oxide layer, and in particular, the second layer 218 may be a silicon dioxide layer.

Section 42 shows the semiconductor wafer 200 having a first masking layer 212. The first masking layer has an opening. Through the opening in the first masking layer 212, a first selectively processable area 214 is defined on the first layer 216.

The first masking layer 212 may be formed by means of photolithographic processes and serve as an etch mask. The masking layer 212 may comprise a photoresist.

The first selectively processable surface 214 may, in particular, define a geometry of a membrane $M_2$ yet to be manufactured.

Section 43 shows the semiconductor wafer 200 with the masking layer 212 removed and the first and second layers 216, 218 partially removed.

The partial or selective removal of the first and second layers 216, 218 can be carried out by means of (deep) reactive ion etching.

The anisotropic etching may take place through the entire first layer 216 (in a z-direction) and the second layer 218. In particular, the anisotropic etching may be stopped, when a surface of the third layer 226 has been exposed, without residues of the second layer 218 remaining on the exposed surface of the third layer 226.

Due to the partial removal of the first and second layers 216, 218, the recess 220 is created.

Section 44 shows the semiconductor wafer 200 with a layer modification 222.

The layer modification 222 may be produced by means of localized thermal oxidation of silicon.

The oxidation may further include growing $SiO_2$ on silicon.

The layer modification 222 extends into a depth $d_7$ of the third layer 226.

The depth $d_7$ may be smaller than a layer thickness $d_8$ of the third layer 226. The depth $d_7$ of the layer modification 222 may be substantially smaller than the layer thickness $d_8$ of the third layer 226, preferably a ratio of the depth $d_7$ to the layer thickness $d_8$ lies between 1:5 and 1:150, more preferably 1:100.

Section 45 shows the semiconductor wafer 200 with the first and second layers 216, 218 completely removed. What remains is the third layer 226 with the embedded layer modification 222.

The first layer 216 can be removed by means of wet chemical etching.

The first and/or the second layer 216, 218 can be removed by polishing, in particular by chemical-mechanical polishing.

The polishing may be carried out down to the third layer. In particular, the polishing may be stopped, when no residues of the second layer 218 remain on the third layer 226.

In section 46, the semiconductor wafer is shown with a membrane layer 224 deposited thereon.

The membrane layer may be deposited areally.

The membrane layer may be deposited by means of sputtering.

The membrane layer may be a thin film. In particular, the membrane may be thinner than 1.0 µm.

The membrane layer may comprise aluminum nitride (AlN), and in particular, the membrane layer may be made of AlN.

FIG. 5 shows the continuation of the manufacture of the membrane component from the silicon wafer pre-patterned by local layer modification and with a continuously deposited membrane layer 224 at various stages of membrane component manufacture, each shown in a sectional view. For better understanding, section 46 is shown in FIG. 5 once more.

Section 47 shows the semiconductor wafer 200 with the third layer 226 partially removed.

Partially removing the third layer may comprise a previous masking of the third layer 226 with a second masking layer that defines a second selectively processable area on the third layer 226.

The second masking layer may be produced by means of photolithographic processes. The masking layer may comprise a photoresist.

The second selectively processable area may result from at least one opening in the second masking layer.

The second selectively processable area may determine a geometry of a recess to be created.

The partial removal of the third layer may be accomplished by means of anisotropic etching (deep reactive ion etching) resulting in a recess 248 in the third layer 226.

The anisotropic etching may stop on the layer modification 222. In particular, the anisotropic etching may be stopped, when a surface of the layer modification has been exposed, without any residues of the third layer 226 remaining on the layer modification 222.

A basic shape of the recess 248 may (substantially) correspond to the second selectively processable area defined by the second masking layer.

Section 47 shows the semiconductor wafer 200 (or membrane component 290) with the layer modification 222 removed, so that a part of the membrane layer 224 is exposed on both sides. The area of the membrane layer 224 exposed on both sides defines the membrane $M_2$.

The removal of the layer modification 222 can be carried out by means of an isotropic etching step.

The isotropic etching may stop in particular at the membrane layer 224 and the third layer 226, so as to form a recess 242 that extends up to underneath the membrane layer 224 and exposes a sidewall 244 (sidewalls) of the third layer 226.

FIG. 6 shows a manufacture of a membrane component 290' from a silicon wafer, pre-patterned by means of local oxidation and provided with a discontinuously deposited membrane layer 224', at various stages of manufacture, each shown in a sectional view.

The representations according to sections 46' to 48' correspond substantially to the sectional views 46 to 48, except that the membrane layer 224' has an opening 250.

The membrane layer 224' may have a plurality of openings, and in particular it may be perforated.

A removal of the layer modification 222 by isotropic etching can be carried out through the opening 250 (on the front side).

FIG. 7 shows various membrane geometries of membrane components 390, 490, 590 and 690 in top views. The areas in dark gray each correspond to a respective membrane layer 324, 424, 524 and 624. For a better representation of the geometries, a dashed-line representation of the structural edges actually located under the membrane layers 324, 424, 524 and 624 has been dispensed with. Instead, a sectional view A-A of one of the membrane components (membrane component 390) shown in FIG. 7 is illustrated.

The sectional view A-A shows the membrane component 390 in a cutaway view. The membrane component comprises a membrane layer 324 with a membrane, a material 344 enclosed by a first layer with an exposed sidewall 344, and a cavity 342.

In the top view, it can be seen that the cavity 342 has a circular basic shape.

The cavity 342 may have a different basic shape, for example, the cavity may have a rectangular, polygonal, or non-circular basic shape.

The introduced material 324 has a circular basic shape.

Through the introduced material 322, a geometry of a membrane in the membrane layer 324 can be defined, since the introduced material 322 (and the membrane layer 322 itself) can stop an isotropic etching process during a step carried out for exposing the membrane (cf. FIGS. 2 and 3, sections 18 and 18', respectively).

The membrane components 390, 490, 590 and 690 shown are identical to one another, except for the geometries of the membrane.

In this respect, 442, 542 and 642 equal to 342 identify a (circular) cavity of the respective membrane component, and 422, 522 and 622 equal to 322 identify a material enclosed by a first layer of the respective membrane component. The enclosed material 422, 522 and 622 equal to 322 has a respective exposed sidewall 444, 544, and 644.

The membrane component 490 has a membrane with a hexagonal basic shape.

The membrane component 590 has a membrane with a square basic shape. In particular, corners of the membrane may be rounded or blunted.

The membrane component 690 has a membrane with a sawtooth-shaped or star-shaped basic shape.

Coordinates of a plane defined by a surface of the membrane component 390, 490, 590 and 690 can unambiguously be defined by an x-y coordinate system.

FIG. 8 shows the membrane component 190 in a sectional view and a detail extract of the membrane component 190.

The detail extract shows a portion of the introduced material 122, of the first layer 116, of the membrane layer 124, and of the membrane $M_1$.

Between the membrane layer 124 and the membrane $M_1$, respectively, and an (exposed) sidewall 144 of the enclosed material 144, an angle $\alpha_1$ is included.

The angle $\alpha_1$ may be substantially 90.0°. The angle $\alpha_1$ may be between 88.0° and 92.0°, and in particular, between 89.0° and 91.0°.

The angle $\alpha_1$ may result from process-related deviations. Due to the angle $\alpha_1$, a deviation $d_{10}$ in a geometry of the introduced material 122 from the selectively processable area 114 previously determined by the first masking layer 112 may occur into a depth (in a z-direction taking as a basis the membrane layer) of the semiconductor wafer 100.

The deviation $d_{10}$ may be less than 20.0 µm, preferably less than 10.0 µm, more preferably less than 1.0 µm.

FIG. 9 shows the membrane component 290 in a sectional view and a detail extract of the membrane component 290.

The cavity 242 comprises a first section 260 and a second section 264. The first section 260 has a first lateral dimension $S_{A1}$. The second section 264 has a second lateral dimension $S_{A2}$.

The first and/or the second lateral dimension $S_{A1}$, $S_{A2}$ may each describe a diameter of a circle.

The second lateral dimension $S_{A2}$ may be unequal to the first lateral dimension $S_{A1}$, and in particular, the second lateral dimension $S_{A2}$ may even be 50% smaller than the first lateral dimension $S_{A1}$ preferably 30%, more preferably 10%.

The detail extract shows, in sections, the third layer 226, the membrane layer 224 and the membrane $M_2$.

Between the membrane layer 224 and the membrane $M_2$, respectively, and the sidewall 244 of the third layer 226, an angle $\alpha_3$ is included.

The angle $\alpha_3$ may be substantially 90.0°. The angle $\alpha_3$ may be between 88.0° and 92.0°, and in particular between 89.0° and 91.0°.

Also the angle $\alpha_3$ may result from process-related deviations. Due to the angle $\alpha_3$, a (geometry) deviation $d_{11}$ (in comparison with a lateral dimension that was predetermined by the selectively processable area) occurs into a depth (in a z-direction taking as a basis the membrane layer 224) of the semiconductor wafer 200.

The deviation $d_{11}$ may be less than 20.0 µm, preferably less than 10.0 µm, more preferably less than 1.0 µm.

I claim:

1. A method for manufacturing a membrane component with a membrane, the method comprising:
   providing a semiconductor wafer (100) with a first layer (116), a second layer (118) and a third layer (126);
   depositing (12) a first masking layer (112) on the first layer (116), the first masking layer defining a first selectively processable area (114) for determining a geometry of the membrane (M1);
   forming a first recess (120) by anisotropic etching of the first layer;
   removing the first masking layer (112);
   introducing (14) a material (122) in the first recess (120);
   depositing (15) a membrane layer (124) on the first layer (116) with the introduced material (122);
   depositing on the third layer (126) a second masking layer that defines a second selectively processable area;
   forming a second recess by anisotropic etching of the third layer (126) and of the second layer (118) up to the first layer (116);
   removing the second masking layer;
   after the removal of the second masking layer, depositing (16) a fourth layer (152) on the third layer (126), on the first layer (116) and on at least one sidewall of the second recess created by anisotropically etching the third (126) and the second layer (118); and
   anisotropically etching (17) an area of the fourth layer (152), the area of the fourth layer (152) contacting the first layer (116), up to the first layer; and
   isotropically etching (18) the first layer (116), the isotropic etching being limited by the membrane layer (124) and by the introduced material (122), so that the membrane (M1) will be exposed.

2. The method according to claim 1, wherein the first layer (116) comprises a material different from that of the second layer (118).

3. The method according to claim 1, wherein the first layer (116) comprises a silicon layer and the second layer (118) comprises an oxide layer.

4. The method according to claim 1, wherein the semiconductor wafer (100) is a silicon-on-insulator wafer.

5. The method according to claim 1, wherein the first layer (116) has a first layer thickness (d1) smaller than a fourth thickness (d4) resulting from the summation of a second layer thickness (d2) of the second layer (118) and a third layer thickness (d3) of the third layer (126).

6. The method according to claim 5, wherein a ratio of the first layer thickness (d1) to the fourth thickness (d4) lies between 1:10 and 1:200.

7. The method according to claim 6, wherein a ratio of the first layer thickness (d1) to the fourth thickness (d4) lies between 1:50 and 1:150.

8. The method according to claim 7, wherein a ratio of the first layer thickness (d1) to the fourth thickness (d4) lies between 1:50 and 1:100.

9. The method according to claim 1, wherein a fourth layer (152) comprises a passivation layer.

10. The method according to claim 1, wherein at least the first or at least the second masking layer comprises a photoresist.

11. The method according to claim 1, wherein the first and the second masking layer are produced by means of photolithography.

12. The method according to claim 1, wherein the membrane (M1) has a circular, a rectangular, a polygonal, or a non-circular basic shape.

13. The method according to claim 1, wherein the membrane (M1) has at least one opening (150).

14. The method according to claim 13, wherein the membrane (M1) is perforated.

15. A method for manufacturing a membrane component with a membrane, the method comprising:
   providing a semiconductor wafer (100) with a first layer (116), a second layer (118) and a third layer (126);
   depositing (12) a first masking layer (112) on the first layer (116), the first masking layer defining a first selectively processable area (114) for determining a geometry of the membrane (M1);
   forming a first recess (120) by anisotropic etching of the first layer;
   removing the first masking layer (112);
   introducing (14) a material (122) in the first recess (120);
   depositing (15) a membrane layer (124) on the first layer (116) with the introduced material (122);

depositing on the third layer (126) a second masking layer that defines a second selectively processable area;

forming a second recess by anisotropic etching of the third layer (126) and of the second layer (118) up to the first layer (116);

removing the second masking layer;

polishing the first layer (116) with the introduced material (122) prior to applying (15) the membrane layer (124); and isotropically etching (18) the first layer (116), the isotropic etching being limited by the membrane layer (124) and by the introduced material (122), so that the membrane (M1) will be exposed.

16. The method according to claim 15, wherein the polishing is a chemical-mechanical polishing.

17. A method for manufacturing a membrane component with a membrane, the method comprising:

providing a semiconductor wafer (100) with a first layer (116), a second layer (118) and a third layer (126);

depositing (12) a first masking layer (112) on the first layer (116), the first masking layer defining a first selectively processable area (114) for determining a geometry of the membrane (M1);

forming a first recess (120) by anisotropic etching of the first layer;

removing the first masking layer (112);

introducing (14) a material (122) in the first recess (120) wherein the introduced material (122) and the second layer (118) comprise an identical material;

depositing (15) a membrane layer (124) on the first layer (116) with the introduced material (122);

depositing on the third layer (126) a second masking layer that defines a second selectively processable area;

forming a second recess by anisotropic etching of the third layer (126) and of the second layer (118) up to the first layer (116);

removing the second masking layer; and isotropically etching (18) the first layer (116), the isotropic etching being limited by the membrane layer (124) and by the introduced material (122), so that the membrane (M1) will be exposed.

18. A method for manufacturing a membrane component with a membrane, the method comprising:

providing a semiconductor wafer (100) with a first layer (116), a second layer (118) and a third layer (126);

depositing (12) a first masking layer (112) on the first layer (116), the first masking layer defining a first selectively processable area (114) for determining a geometry of the membrane (M1) wherein the membrane (M1) has at least one opening (150);

forming a first recess (120) by anisotropic etching of the first layer;

removing the first masking layer (112);

introducing (14) a material (122) in the first recess (120);

depositing (15) a membrane layer (124) on the first layer (116) with the introduced material (122);

depositing on the third layer (126) a second masking layer that defines a second selectively processable area;

forming a second recess by anisotropic etching of the third layer (126) and of the second layer (118) up to the first layer (116);

removing the second masking layer; and isotropically etching (18) the first layer (116), the isotropic etching being limited by the membrane layer (124) and by the introduced material (122), so that the membrane (M1) will be exposed, wherein the isotropic etching is carried out through the at least one opening (150) of the membrane (M1).

\* \* \* \* \*